(12) United States Patent
Hannum

(10) Patent No.: US 6,172,894 B1
(45) Date of Patent: Jan. 9, 2001

(54) SEMICONDUCTOR MEMORY CELL HAVING MORE THAN TWO STABLE STATES

(75) Inventor: David P Hannum, Fort Collins, CO (US)

(73) Assignee: Hewlett-Packard Company, Palo Alto, CA (US)

(*) Notice: Under 35 U.S.C. 154(b), the term of this patent shall be extended for 0 days.

(21) Appl. No.: 09/505,082

(22) Filed: Feb. 16, 2000

(51) Int. Cl.[7] ..................................................... G11C 15/00
(52) U.S. Cl. ................................................................ 365/49
(58) Field of Search ............................... 365/49, 154, 156

(56) References Cited

U.S. PATENT DOCUMENTS 5,283,882 * 2/1994 Smith et al. ............................ 365/49
5,327,372 * 7/1994 Oka et al. ............................... 365/49
5,999,435 * 12/1999 Henderson et al. ................... 365/49

\* cited by examiner

*Primary Examiner*—Throng Phan

(57) ABSTRACT

A three state, dual port CAM cell responsive to three combinations, i.e., 0,0 and 1,0 and 0,1, of two binary inputs includes a pair of latches, each having a pair of inverters connected in a regenerative feedback circuit. For the 0,0 combination, a driver and FET disable the second inverter in such a way that output terminals of the latches supply 0,0 to a pair of data lines. For the 1,0 combination, both inverters of both latches are enabled, causing the latches to supply the data lines with 1,0. For the 0,1 combination, the second inverter is disabled in such a way that the output terminals of the latches supply the data lines with 0,1.

20 Claims, 3 Drawing Sheets

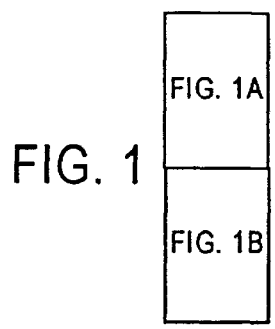
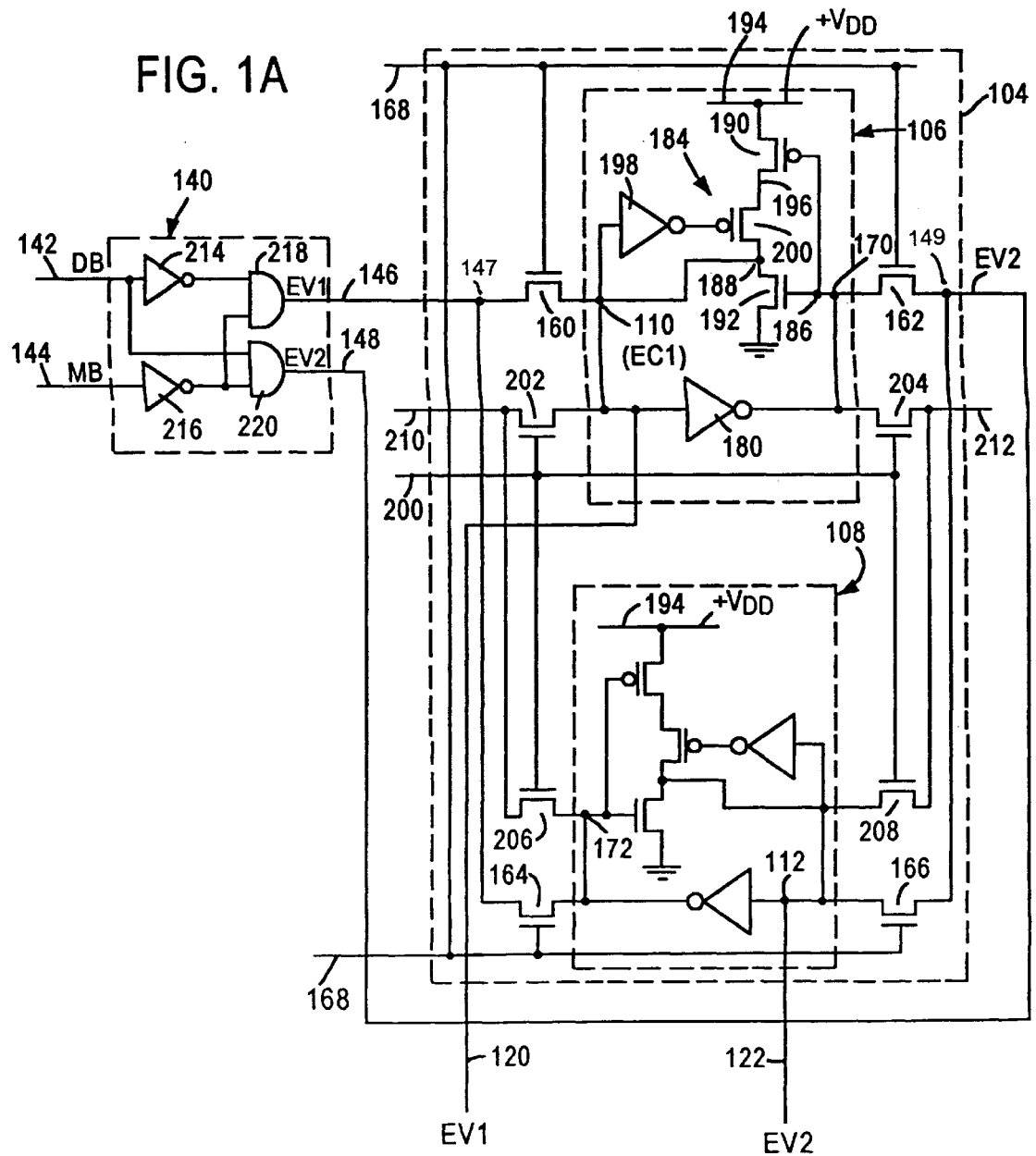

US 6,172,894 B1

SEMICONDUCTOR MEMORY CELL HAVING MORE THAN TWO STABLE STATES

FIELD OF THE INVENTION

The present invention relates generally to semiconductor memory cells and more particularly to a semiconductor memory cell having only two signal input terminals for more than two combinations of binary signals to be stored in the cell and including circuitry for storing more than two stable states.

BACKGROUND ART

Typical prior art semiconductor memory cells have only two stable states for storing complementary bit levels. In a first of the states the cell stores a binary zero level, and in a second of the states the cell stores a binary one level. The cell typically includes first and second output terminals such that when the cell stores a binary zero level the cell respectively supplies low and high voltages to the first and second terminals; when the cell stores a binary one level the cell respectively supplies high and low voltages to the first and second output terminals. The typical cell also includes first and second signal input terminals responsive to complementary bi-level voltages such that when a binary zero level is written into the cell, low and high voltages are respectively applied to the first and second input terminals; when a binary one level is written into the cell the first and second input terminals are respectively responsive to high and low voltage levels.

The typical prior art semiconductor memory cell includes first and second inverters connected to each other in a back-to-back regenerative feedback arrangement. Each of the inverters has an input and output terminal such that the output terminal of the first inverter is connected to the input terminal of the second inverter and the output terminal of the second inverter is connected to the input terminal of the first inverter. In essence, the output terminals of the first and second inverters are the first and second output terminals of the cell from which the binary state of the cell is read during a read operation. The voltage levels at the first and second input terminals are respectively supplied to input terminals of first and second write lines or leads via gates that are open during a write operation. In the typical integrated circuit semiconductor memory, the gates are referred to as pass gates, each formed by a source drain path of a field effect transistor (FET) having a gate electrode responsive to a write pulse source. The voltage levels at the cell first and second output terminals are supplied to first and second data lines or leads that are coupled to a read logic network on an integrated chip including the memory cells.

A substantial amount of the area of each cell is occupied by the write and data lines. The write and data lines occupy a considerably greater area of each cell than the active elements, i.e., field effect transistors (FETs), forming the inverters of each cell. To maximize packing density of each cell on the integrated circuit chip, it is desirable to maximize the use of the write and data lines of each memory cell.

SUMMARY OF THE INVENTION

I have realized that greater packing density can be achieved by modifying the circuitry of the typical prior art cell so that it can store more than two states, without modifying the write and data lines associated with each cell. Consequently, the area of a cell is not increased appreciably because the cell basic geometry including the write and data lines has not been altered. This is true even though the cell circuitry is modified to include an increased number of active devices. Because the write and data lines occupy a considerably higher percentage of the cell area than the active devices, the change in the cell active device complement does not substantially increase cell area.

The result is achieved by supplying more than two combinations of binary voltage levels to the cell first and second input terminals and by arranging the cell so that it can supply more than two combinations of binary voltage levels to the cell data lines. In the preferred embodiment, the cell input terminals are responsive to three combinations of binary input signals, namely (0,1), (1,0) and (0,0). However, the concept of the invention is not limited to these three combinations and is expandable to include all four combinations of the binary levels that can be applied to the first and second input terminals of the cell, i.e., (0,0), (0,1), (1,0) and (1,1).

It is, accordingly, an object of the present invention to provide a new and improved semiconductor memory having cells for storing more than two binary levels.

Another object of the present invention is to provide a new and improved semiconductor memory cell having an area that is not substantially greater than typical prior art cells, but which is capable of storing more than two binary levels.

An additional object of the invention is to provide a new and improved semiconductor memory having cells for storing more than two binary levels, wherein each cell includes the same complement of write and data lines as prior art cells having a similar cell geometry.

According to one aspect of the invention, a semiconductor memory cell for storing more than two binary states comprises first and second signal input terminals that are responsive to more than two combinations of binary levels of first and second binary sources. Active circuit elements having inputs connected to be responsive to voltages at the first and second input terminals supply voltages to first and second data lines of the cell so that the cell stores and supplies to the first and second data lines (a) a first combination of binary voltage levels in response to the first and second binary sources writing a first combination of binary levels into the cell via the first and second signal input terminals, (b) a second combination of binary voltage levels in response to the first and second binary sources writing a second combination of binary levels into the cell via the first and second signal input terminals and (c) a third combination of binary voltage levels in response to the first and second binary sources writing a third combination of binary levels into the cell via the first and second signal input terminals.

Another aspect of the invention relates to a semiconductor memory cell that responds to first and second binary sources and stores three combinations of values of the first and second binary sources. The cell includes first and second latches, each having first and second storage nodes. The first and second storage nodes of the first latch are respectively responsive to the first and second binary sources during a write operation of the cell. The first and second nodes of the second latch are respectively responsive to the second and first binary sources during the write operation. Each of the latches includes substantially identical circuitry including (a) first and second inverters selectively connected in a regenerative back-to-back relation between the first and second nodes, and (b) a control circuit responsive to the bit at one of the nodes for controlling the connections of the inverters to each other.

An additional aspect of the invention concerns a semiconductor memory cell that responds to first and second binary sources and stores three combinations of values of the first and second binary sources. The cell comprises first and second latches, each having first and second storage nodes. The first and second nodes of the first latch are respectively responsive to the first and second binary sources during a write operation of the cell. The first and second nodes of the second latch are respectively responsive to the second and first binary sources during the write operation. Each of the latches includes substantially identical circuitry including first and second inverters selectively connected in a regenerative back-to-back relation between the first and second nodes. A control circuit enables the inverters to store more than two combinations of the values of the bits of the binary sources.

Hence the cell preferably includes first, second, third and fourth inverters, each including an input terminal and an output terminal. The input and output terminals of the first and second inverters are connected to each other to form the first regenerative feedback circuit. The input and output terminals of the third and fourth inverters are connected to each other to form the second regenerative feedback circuit. The input terminal of the first inverter is selectively coupled during a write operation to the first signal input terminal of the cell. The input terminal of the third inverter is selectively coupled during a write operation to the second signal input terminal of the cell. The output terminal of the first inverter is connected to the first data line of the cell. The output terminal of the third inverter is connected to the second data line of the cell.

In the preferred embodiment, the first and second binary sources have the same value in a first of the combinations. The control circuit and the first and second inverters of each latch are connected and arranged so that the control circuit disables the second inverter in response to the first and second binary sources having the values of the first combination to cause (a) a first voltage associated with the value of the first binary source in the first combination to be supplied to and maintained at the first node, (b) a voltage between the voltage levels of the bits for the first combination to be at the second node during the write operation, and (c) the first voltage to remain at the first node after the write operation for the first combination has been concluded and until the next write operation for the cell occurs. The control circuit and the first and second inverters of each latch are arranged so that the second node is driven to a second voltage level after the write operation for the first combination has been concluded and until the next write operation for the cell occurs.

When the first and second binary sources respectively have first and second different values in a second of the combinations, the first and second inverters are enabled so the first and second different values are respectively supplied to and maintained at the first and second nodes during the write operation and after the write operation has been concluded until the next write operation for the cell occurs. When the first and second bits respectively have the second and first values in a third of the combinations, the second and first different values are respectively supplied to and maintained at the first and second nodes during the write operation and after the write operation has been concluded until the next write operation for the cell occurs.

The second inverter preferably includes an element that is connected to be responsive to the voltage at the second node. When the first combination is written into the cell, the element is switched to a low impedance state and connected to supply the second voltage to the first node in response to the first voltage being at the second node.

The latches and cell are preferably included in a dual port content address memory (CAM) cell including first and second read circuits respectively connected to first and second data lines responsive to voltages at the first and second nodes. The dual port CAM cell also includes first and second match circuits respectively connected to first and second complementary reference lines. Both match circuits are connected to the first and second data lines.

The above and still further other objects, features and advantages of the present invention will become apparent upon consideration of the following detailed description of a specific embodiment thereof, especially when taken in conjunction with the accompanying drawings.

BRIEF DESCRIPTION OF THE DRAWINGS

FIG. 1, including FIGS. 1A and 1B, is a circuit diagram of a preferred embodiment of a dual port semiconductor configured as a dual port mask based content addressable cell for storing three stable states in accordance with a preferred embodiment of the present invention.

DETAILED DESCRIPTION OF THE DRAWING

Figure 1B:
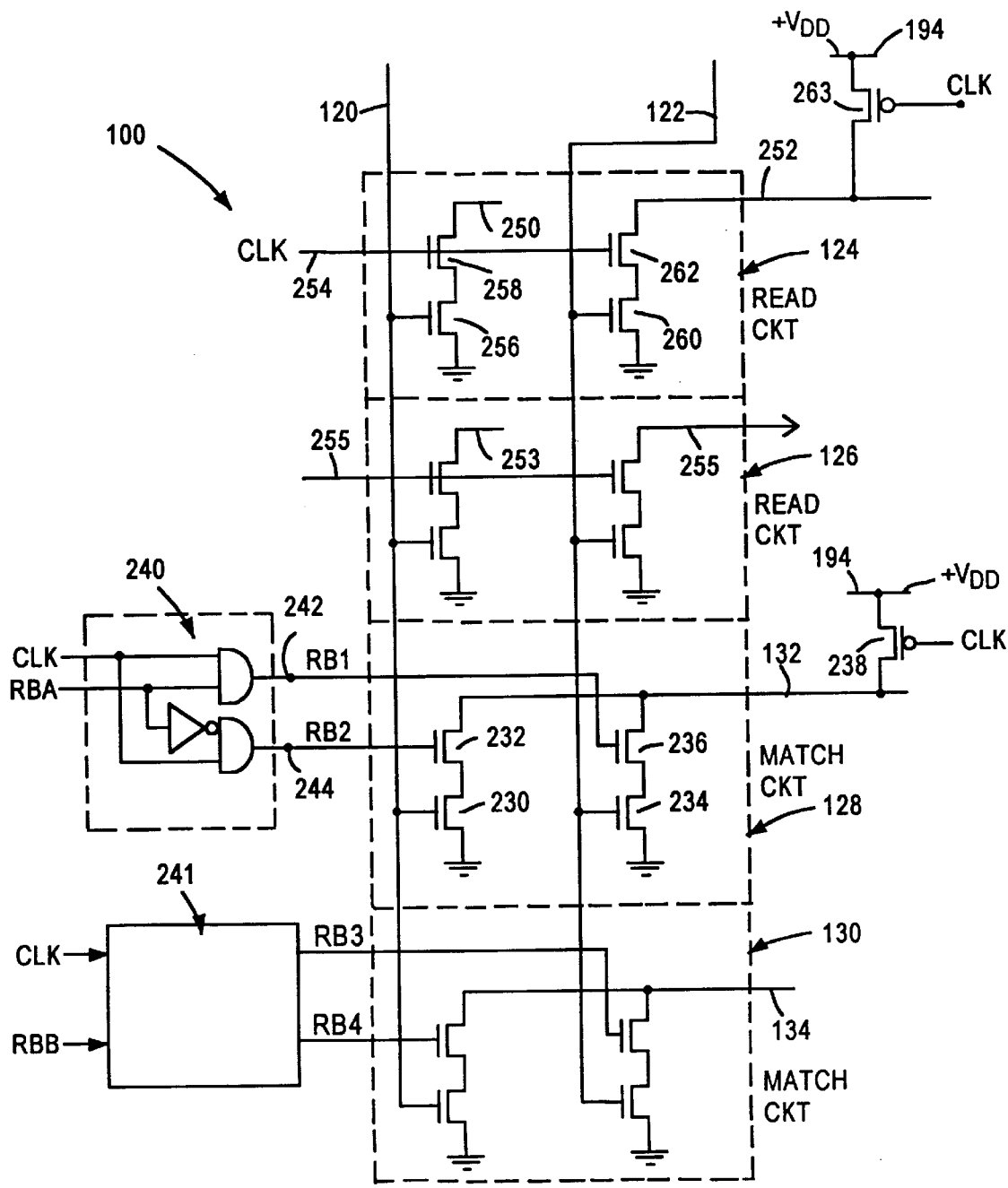

FIG. 1 is a circuit diagram of dual port CAM cell 100 on an integrated circuit including a matrix of many dual port CAM cells identical to the cell of FIG. 1. Cell 100 includes two data lines 120 and 122 tied to a pair of storage nodes 110 and 112, two read circuits 124, 126, two matching or comparison circuits 128, 130 and two pairs of write lines 146, 148 and 210, 212. Write lines 146 and 148 are responsive to a pair of encoded bits EV1 and EV2 resulting from the combination of a mask bit MB and a data bit DB for the cell. Cell signal input terminals 147 and 149, respectively connected to write lines 146 and 148, respond to three combinations of binary voltage levels that result from the combination of EV1 and EV2. Cell 100 is a latch that can respond to and store three different combinations of the encoded bits EV1 and EV2 but only has two input terminals 147 and 149 responsive to EV1 and EV2. Cell 100 is selectively masked by the encoded bits. While cell 100 is described as a dual port maskable CAM cell, it is to be understood that the multiple state storage principles of the invention are applicable to other types of signals and cells.

Mask bit MB for selectively masking and unmasking cell 100 is combined in encoder 140 with data bit DB to derive encoded bits EV1 and EV2 that are written to cell 100 via write lines 146 and 148. One encoder is provided for each column of the matrix including cell 100. The output of the encoder is applied to cells in different rows of the matrix at different times when the write lines are enabled. Cell 100 stores encoded bits EV1 and EV2 and responds to the other inputs of the cell to (1) indicate a match between the data bit which resulted in the encoded bit and an input reference bit, (2) indicate the value of the data bit DB stored in cell 100, or (3) perform a masking operation.

With greater reference to FIG. 1, dual port CAM cell 100 includes an SRAM memory cell 104 configured to store three combinations of a pair of bits EV1 and EV2. Low and high logic levels of the binary bits of cell 100 respectively correspond to voltage levels near ground and near a DC power supply line voltage (+$V_{DD}$) for the integrated circuit chip including the cell; +$V_{DD}$ is approximately 1.3 volts. A first pair of bits at a first port including lines 146 and 148 is written into and stored in cell 100 during a first interval while a high voltage level is applied to word line 168. A second pair of bits at a second port including lines 210 and 212 is written into and stored in cell 100 during a second interval while a high voltage level is applied to line 200. The bits on lines 210 and 212 can be a combination of a different data bit and a mask bit or two complementary values of a single data bit.

While the following description deals primarily with how cell 100 responds to three combinations of the binary values of EV1 and EV2 on lines 146 and 148, it is to be understood that the cell responds in the same way to three combinations of the binary values on lines 210 and 212.

Cell 100 includes dual read circuits 124 and 126. Read circuits 124 and 126 respectively respond to positive "dump" voltage pulses applied at different times to lines 254 and 255 to provide read out to lines 250, 252 and 253, 254 of the two binary values cell 100 stores. Hence, during reading of port 124, lines 250, 252 indicate the value cell 100 stores and during reading of port 126, lines 253, 255 indicate the value cell 100 stores.

Cell 100 also includes dual match (i.e., comparison) circuits 128 and 130. Match circuits 128 and 130 respectively respond to complementary reference bits RB1, RB2 and RB3, RB4 that circuits 240 and 241 respectively derive at different times in response to input bits RBA and RBB. Circuit 128 or 130 responds to RB1, RB2 or RB3, RB4, as appropriate, to compare the two bits that cell 100 stores with the reference bits. When the bits stored in cell 100 are the same as the reference bits RB1 and RB2 because cell 100 is not masked and cell 100 stores an indication of data bit DB differing from RBA, a precharged high voltage ($+V_{DD}$) on line 132 is reduced substantially to zero. When the bits stored in cell 100 differ from the reference bit RBA because cell 100 is masked or because cell 100 stores an indication of DB not being masked and DB being the same as RBA, precharge voltage ($+V_{DD}$) remains on line 132. Match circuit 130 responds at a different time to the RB3, RB4 outputs of circuit 241 and the bits that cell 100 stores to drive line 134 in the same way matching circuit 128 drives line 132.

To store the three combination of bits on lines 146 and 148 or on lines 210 and 212, cell 104 includes a first memory, i.e., latch circuit 106, and a second memory, i.e., latch circuit 108. Latch circuits 106 and 108 respectively include first and second storage nodes 110 and 112 respectively tied to data lines 120 and 122. Each of latches 106 and 108 is a tri-state storage device that can store (1) two complementary bit values (i.e., a one and a zero or a zero and a one) or (2) two zero values. Because latches 106 and 108 are the same, the description is generally confined to latch 106.

Cell 100 is selectively masked and unmasked in response to encoded bits EV1 and EV2 stored at nodes 110 and 112. The bits stored at storage nodes 110 and 112 are respectively coupled via first and second data lines 120 and 122 as inputs to: (1) read circuits 124 and 126, and (2) matching circuits 128 and 130 for comparing a data bit represented by encoded values EV1 and EV2 with complementary reference data bits RB1, RB2 and RB3, RB4. Circuit 240 responds to reference bit RBA and a clock wave to derive RB1, RB2 at terminals 242, 244, respectively, while circuit 241 responds to reference bit RBB and the clock wave to derive RB3, RB4. The bits at terminals 242 and 244 are supplied to matching circuit 128.

Encoder 140 combines data bit DB that a suitable source (not shown) supplies to line 142 with mask bit MB that a suitable source (not shown) supplies to line 144; MB=1 signifies a mask operation, and MB=0 signifies that there is no mask operation. Encoder 140 combines DB and MB to derive encoded bits EV1 and EV2 on lines 146 and 148 in accordance with the following truth table:

TABLE I

| data bit DB | mask bit MB | EV1 | EV2 |
|---|---|---|---|
| 0 | 0 | 1 | 0 |
| 1 | 0 | 0 | 1 |
| 0 or 1 | 1 | 0 | 0 |

Table I represents the Boolean relationships $$EV1=(\overline{MB})(\overline{DB})$$

$$EV2=(\overline{MB})(\overline{MB})$$

To these ends, encoder 140 includes inverters 216 and 214, as well as AND gates 218 and 220. Inverters 216 and 214 respectively respond to the DB and MB signals on lines 142 and 144 and each of gates 218 and 220 has one input terminal responsive to the inverted replica of MB that inverter 216 derives. The remaining input terminals of gates 220 and 218 respectively respond to the DB signal on line 142 and an inverted replica thereof which inverter 214 derives. Gates 218 and 220 respectively derive EV1 and EV2 in accordance with Table I since the inverted replica of MB which inverter 216 derives when MB=1 causes low voltage, binary zero EV1 and EV2 outputs of gates 218 and 220. When MB=0, the EV1 output of gate 218 responds to the output of inverter 214 to derive a value which is the one's complement of DB (i.e., is inverted with respect to DB), and the EV2 output of gate 220 responds directly to DB to have the same value as DB. Any other suitable logic circuitry can be used to derive the values of EV1 and EV2 and encoding need not necessarily be in accordance with Table I.

The value of mask bit MB controls the selective masking and unmasking of CAM cell 100 indirectly through encoded values EV1 and EV2 stored in cell 104. If MB has a low (0) logic level, cell 100 is not masked and operates so EV1 and EV2 are respectively the complement of data bit DB and the same as DB. In response to MB=0, one of matching circuits 128 or 130 can discharge its associated match lines 132 and 134 during a CAM look up. Lines 132 and 134 are discharged if the value of the binary data bit DB which caused latches 106 and 108 to be set is the same as reference bits RBA and RBB respectively applied to circuits 240 and 241 at different times. If DB=RBA, line 132 stays high; if DB=RBB, line 134 stays high.

Conversely, a high logic value of mask bit MB masks CAM cell 100 whereby matching circuits 128, 130 are prevented from discharging associated match lines 132, 134 during a CAM look up operation, even if DB differs from RBA and RBB. While mask bit MB is a logic "1", encoder 140 supplies low logic values EV1 and EV2 to storage nodes 110 and 112, respectively. The resulting low voltages stored at nodes 110 and 112 are coupled by data lines 120 and 122 to matching circuits 128, 130 whereby the low voltages prevent discharging of associated match lines 128, 130.

From the above description, memory cell 104 stores three different value states of encoded values EV1, EV2, namely, states (0,1), (1,0) and (0,0). Thus, the two binary values at nodes 110 and 112 and on lines 120 and 122 can have three different combinations of values. In contrast, prior art memory cells typically only store two value combinations, namely, states (1,0) and (0,1).

Memory cell 104 is now described in detail. Memory cell 104 includes first and second latch circuits 106 and 108 for respectively latching encoded bits EV1 and EV2. Latch circuits 106 and 108 have mirror image circuit configurations, hence a detailed description of latch 106 suffices for latch 108. Write access to latches 106, 108 is provided via the first write port of memory cell 104 including first and second pairs of N-channel pass gate FETs 160, 162 and 164, 166, and a word line 168 connected to the gate electrodes of each of FETs 160, 162, 164 and 166.

Pass gate FETs 160, 162 have source drain paths respectively connected between (1) terminal 147 that carries EV1 and memory cell node 110 where EV1 is stored, and (2) terminal 149 that carries EV2 and a "hidden" node 170 of latch 106. Similarly, FETs 164, 166 have source-drain paths respectively coinected between terminal 147 and a "hidden" node 172 of latch 108 and terminal 149 and memory cell node 112 of latch 108 where EV2 is stored.

To write the encoded values EV1, EV2 to respective nodes 110, 112, the voltage on word line 168 is pulsed high during a write cycle of CAM cell 100, thereby respectively connecting terminals 147 and 149 with nodes 110 and 112 through pass gates 160 and 166. Latches 106 and 108 respectively latch the values EV1 and EV2 applied to nodes 110 and 112.

Latch 106 includes a first inverter 180 having an input and an output respectively tied to nodes 110 and 170, to thereby invert a logic level at node 110 and apply the inverted level to node 170. Latch 106 also includes a selectively enabled inverter circuit 184 cross-coupled with inverter 180. Inverter 184 includes an input node 186 and an output node 188 respectively tied to nodes 170 and 110. Inverter 184, when enabled, selectively inverts a logic level at node 170 and applies the inverted level to node 110.

Inverter 184 is selectively enabled and disabled by the voltage at node 110 (i.e., by bit EV1). Inverter 184 is enabled to operate as a normal inverter in response to a high logic level being at node 110 (i.e., while EV1="1"), whereby inverter 180 and inverter 184 form a normal, cross-coupled inverter latch. On the other hand, inverter 184 is disabled in response to a low logic level being at node 110 (i.e., while EV1="0"), whereby the inverting function of inverter 184 is effectively decoupled from latch 106. Inverter 184 is controlled in this manner to prevent the occurrence of indeterminate voltages (i.e., voltages approximately equal to one-half the power supply voltage +$V_{DD}$) at node 110 while pass gate FETs 160, 162 are closed. Latch 108 is similarly configured to prevent the occurrence of indeterminate voltages at node 112 when pass gate FETs 164, 166 are closed.

Inverter 184 includes P-channel FETs 190 and 200 and N-channel FET 192 having source drain paths series connected between +$V_{DD}$ and ground. The voltage at node 170 drives the gate electrodes of FETs 190 and 192 in parallel so that FETs 190 and 192 have complementary on and off states. Inverter 198, responsive to the voltage at node 110, drives the gate electrode of P-channel FET 200.

Figure 2:
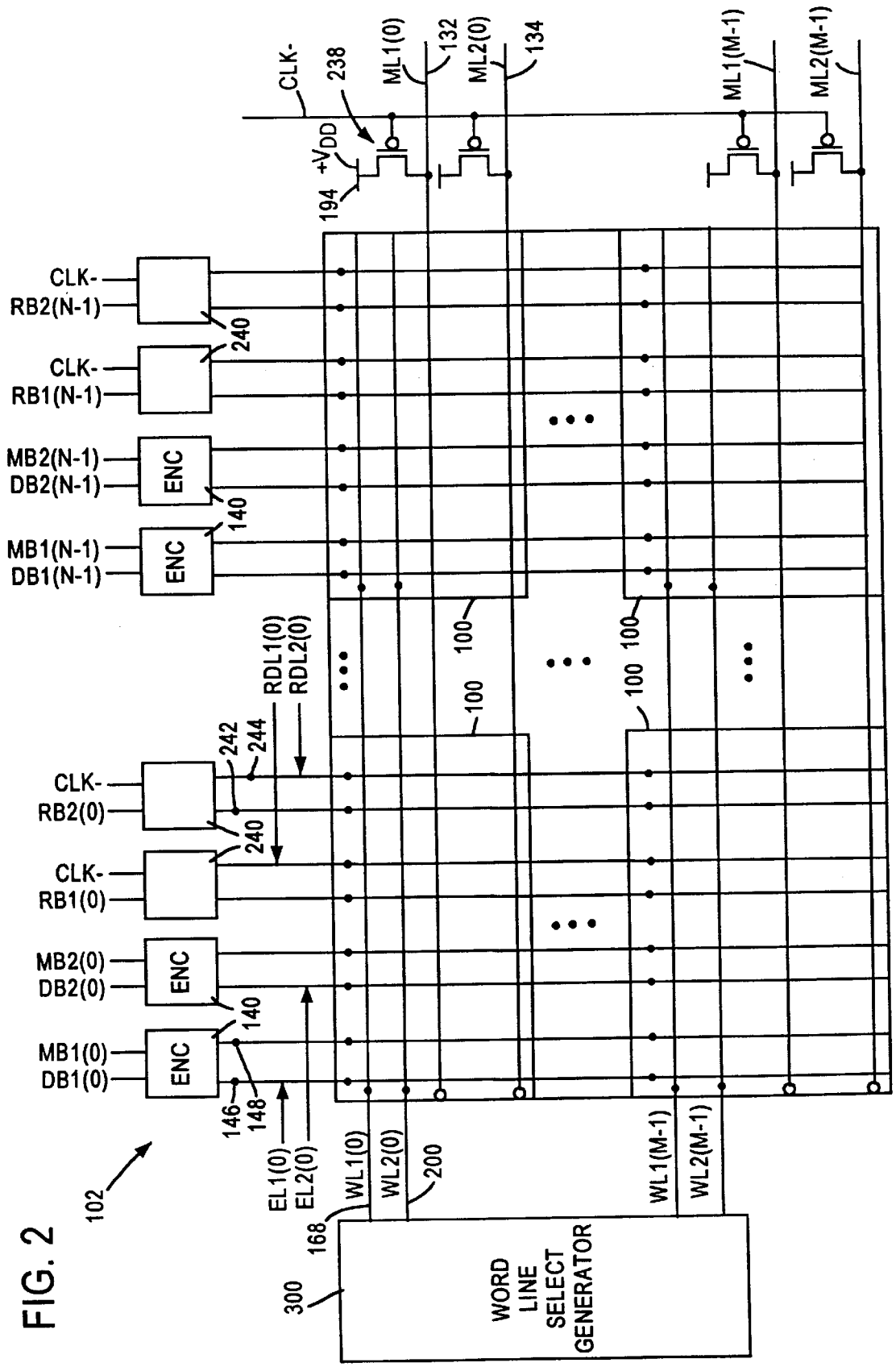
FIG. 2 is a circuit diagram of a CAM array including many of the CAM cells of FIG. 1.

Since latches 106 and 108 have circuit configurations that are mirror images of each other as viewed from left-to-right in FIG. 2, from an operational viewpoint nodes 110 and 170 of latch 106 respectively correspond to nodes 112 and 172 of latch 108.

The operation of latch 106 during a write cycle to CAM cell 104 is now described. Assume first that logic values "1" and "0" for EV1 and EV2 are concurrently written from encoder 140 to memory cell 104 via the first write port, including FETs 160, 162, 164 and 166. Pulsing word line 168 high during a write cycle of cell 104 causes the source drain paths of pass gate FETs 160–166 to turn ON to cause application of a logic "1" (EV1) high voltage at terminal 147 to nodes 110 and 172 of latches 106 and 108 and a logic "0" (EV2) low voltage at terminal 149 to nodes 112 and 170 of latches 108 and 166. The logic "1" at node 110 enables the inverting operation of inverter 184, whereby cross-coupled inverters 184 and 180 latch the logic values EV1 and EV2=0 respectively applied to nodes 110 and 170. The logic values EV2=0 and EV1=1 are respectively latched at nodes 112 and 172 of latch 108. Operation of latch 108 in response to EV2=0 and EV1=1 is the same as operation of latch 106 in response to EV1=0 and EV2=1. This operation of latch 106 is described infra. Because of the regenerative feedback connections of inverters 180 and 184 to nodes 110 and 170 the voltages on lines 120 and 122 remain at the high and low values at nodes 110 and 112, to which the lines are tied, after the pass gates formed by FETs 160–168 turn off in response to a low voltage on line 168.

Assume next that logic values "0" and "1" for EV1 and EV2 are concurrently written to and stored by memory cell 104. Pulsing word line 168 high opens pass gate FET 160 so the EV1=0 at terminal 147 is applied to node 110, thus disabling the inverting operation of inverter 184. Concurrently, the EV2=1 at terminal 149 is applied through pass gate FET 162 to node 170 to turn off FET 192. Consequently, the logic "0" at node 110 is not affected by the high level at node 170. The low level at the input of inverter 180 causes inverter 180 to drive node 170 high, thereby reinforcing the logic "1" already at node 170. Consequently, logic values "0" and "1" are respectively at nodes 110 and 170 of latch 106 while pass gate FETs 160 and 162 are on.

When pass gate FETs 160 and 162 turn off in response to a low voltage on line 168, the voltage at node 110 does not float, even though node 110 is decoupled from line 146. Floating of node 110 is prevented because the output of inverter 180 is connected to the +$V_{DD}$ power supply voltage through the low source drain impedance of the P-channel FET (not shown) of inverter 180. The +$V_{DD}$ voltage at the output of inverter 180 is applied to the gate electrode of FET 192 to keep the source drain impedance of FET 192 low so terminal 188 and node 110 are substantially at ground potential. As a result, node 110 and line 120 are latched to a low level while node 170 is latched to a high level. Logic values "0" and "1" are respectively latched at nodes 172 and 112 of latch 108, as described supra in connection with the description of latch 106 in response to EV1=1, EV2=0.

Assume next that MB=1 is applied to mask cell 104. In response to MB=1, EV1=0 and EV2=0 are concurrently written to and stored by memory cell 104 when word line 168 is pulsed high to open pass gate FETs 160 and 162. Pulsing word line 168 high during a write operation causes terminal 147 to apply a logic "0" to node 110 thus disabling the inverting operation of inverter 184 since inverter 198 applies a low level to the gate electrode of FET 184. While pass gate FET 162 is enabled, an indeterminate voltage is produced at node 170 because the low EV2=0 voltage that terminal 147 applies to node 170 "fights" with a high voltage that inverter 180 supplies to node 170. This "fight" occurs because the EV1=0 encoder output at terminal 147 causes inverter 180 to apply a high voltage to node 170.

The voltage at node 170 thus resides somewhere between a logic low and a logic high, at a voltage dependent primarily on the drive capacity of the output of encoder 140 on line 148 and the drive capacity of inverter 180. However, as soon as word line 168 goes low after completing the write cycle, the "fight" between encoder 146 and inverter 180 ceases because FETs 160 and 162 turn off, so nodes 110 and 170 are decoupled from lines 146 and 148. The high +$V_{DD}$ voltage at node 170 and the output of inverter 180 persists because of the connection of the turned on P-channel FET of inverter 180 to +$V_{DD}$. The high voltage at node 170 turns on FET 192 so terminal 188 and node 110 are at the low voltage. Consequently, after completion of the write cycle, logic values "0" and "1" are respectively stored at nodes 110 and 170 of latch 106.

Latch 108 responds to EV1=0, EV2=0 the same way that latch 106 responds to these values, so logic values "1" and "0" are respectively latched at nodes 172 and 112 of latch 108. Consequently, nodes 110 and 112, as well as lines 120 and 122, are all latched to a low voltage after the write operation has been completed so that cell 110 stores the encoded bits EV1=0, EV2=0.

Encoded data can also be written to memory cell 104 using a second write port coupled with cell 104. The second write port includes a word line 200 and pass gates 202, 204, 206, and 208, all configured and coupled with memory cell 104 in a similar fashion to the circuits of the first write port, described above. An additional encoder, not shown, can provide encoded bits to data lines 210 and 212 associated with the second write port or data lines 210 and 212 can respond to as many as three combinations of two bits that are not encoded.

Matching circuit 128 and the operation thereof during a look up operation of CAM cell 100 are now described in detail. Matching circuit 128 includes first and second pairs of N-channel FETs 230, 232 and 234, 236 for discharging associated match output line 132 during an unmasked CAM look up operation if a mismatch occurs between a data bit DB on line 142, as stored in cell 104, and reference bit RBA. The source-drain paths of FETs 230 and 232 are connected in series with each other, between match line 132 and ground. FETs 234 and 236 are similarly connected. The gates of FETs 230 and 234 are respectively connected to nodes 110 and 112 of cell 104 via data lines 120 and 122.

A match line precharge circuit includes precharge transistor 238 for pre-charging match line 132 prior to a CAM look up operation. P-channel FET 238 includes a source-drain path connected between +$V_{DD}$ power supply rail 194 and match line 132. FET 238 is turned on and off during respective low and high voltage level half cycles of clock wave CLK applied to the gate electrode of FET 238. Prior to a CAM look up operation, FET 238 is turned on during a low voltage half cycle of clock wave CLK, thus precharging match line 132 to nearly +$V_{DD}$.

Reference bit generating circuit 240 supplies complementary reference bits RB1 and RB2 to matching circuit 128 during the high voltage clock half cycle. FETs 230–236 of matching circuit 128 compare the reference bits to the latched bits on lines 120 and 122. Reference bit generating circuit 240 includes first and second inputs respectively responsive to reference bit RBA and clock wave CLK. Reference circuit 240 includes first and second AND gates, each having a first input directly responsive to CLK and a second input responsive directly to RBA and an inverted replica of RBA. The first and second AND gates respectively have outputs 242 and 244 for deriving complementary reference bits RB1 and RB2. The gate electrodes of matching circuit FETs 232 and 236 are respectively connected to be responsive to reference circuit outputs 244 and 242.

During high voltage half cycles of clock wave CLK following the clock low voltage half cycle which resulted in precharging line 238, reference circuit 240 derives complementary reference data values RB1 and RB2 representing reference bit RBA. Namely, if RBA="1", then RB1="1" and RB2="0"; if RBA="0", RB1="0" and RB2="1". During low voltage half cycles of clock wave CLK, reference circuit 240 drives both values RB1 and RB2 to low logic levels to turn off FETs 232 and 236 to avoid triggering a false discharge of match line 132.

A CAM look up operation occurs during high voltage half cycles of clock wave CLK because during these half cycles, match line 132 has been precharged to nearly +$V_{DD}$ and circuit 240 supplies to matching circuit 128 complementary reference values RB1 and RB2 representing the value of reference bit RBA. Match line 132 is discharged to a low logic level if FETs 230 and 232 are concurrently turned on by high logic levels applied to the gate electrodes thereof. In other words, match line 132 is discharged while RB2 and the voltage on line 120 are both high, or while RB1 and the voltage on line 122 are both high.

Accordingly, if the voltages on lines 120 and 122 are both low because cell 104 is masked, as occurs when EV1=0, match line 132 cannot be discharged to indicate a mismatch between reference bit RB and data bit DB. This is because the low voltages on lines 120 and 122 turn off FETs 230 and 234 to prevent discharge of the +$V_{DD}$ voltage on line 132, regardless of the values of RB1 and RB2.

When MB=0, cell 104 is not masked and matching circuit 128 responds to reference bit RBA and the data bit DB as encoded into bits EV1 and EV2, as stored in cell 104. Under this circumstance, circuit 128 functions as an exclusive-nor (XNOR) gate to compare the bi-level voltages on lines 120 and 122 with RB1 and RB2, in accordance with the following truth table.

TABLE II

| DB | EV1 on 120 | EV2 on 122 | RBA | RB1 | RB2 | match line result |
|---|---|---|---|---|---|---|
| 0 | 0 | 1 | 0 | 0 | 1 | 1 |
| 0 | 0 | 1 | 1 | 1 | 0 | 0 |
| 1 | 1 | 0 | 0 | 0 | 1 | 0 |
| 1 | 1 | 0 | 1 | 1 | 0 | 1 |

From TABLE II, line 132 has a high voltage when the data bit DB on line 142, as stored in encoded form in cell 104, is the same as the reference bit RBA. This action occurs because the low voltage on line 120 turns off FET 230 while the low value of RB1 turns off FET 236, or the low value of RB2 turns off FET 232 while the low voltage on line 122 turns off FET 234. Line 132 has a low voltage when the data bit on line 142, as stored in encoded form in cell 104, differs from the reference bit because the high voltage on line 120 turns on FET 230 while the high value of RB2 turns on FET 232, or the high value of RB1 turns on FET 236 while the high voltage on line 122 turns on FET 234.

Dual port CAM cell 100 includes first and second identical read ports 124 and 126 which are operative when the cell is being read in a non-associative manner. Hence, the following description of read port 124 suffices for read port 126. Read port 124 can read the three combinations of two binary bits on data lines 120 and 122. Read port 124 includes first and second read lines 250 and 252 for respectively receiving logic values indicative of the voltages on lines 120 and 122 during high voltage half cycles of clock wave CLK on read dump line 254. Read port 124 includes a first pair of N-channel FETs 256, 258 having gate electrodes connected respectively to line 120 and read dump line 254, and source-drain paths connected in series between read line 250 and ground. A second pair of FETs 260, 262 has the respective gate electrodes thereof connected to line 122 and read dump line 254, and the source-drain paths thereof connected in series between read line 252 and ground. During the CLK low voltage half cycle read lines 250 and 252, like match line 132, are precharged to $+V_{DD}$ through the source drain path of P-channel FET 263. While read dump line 254 has a high voltage during a read operation, a high logic value on one of lines 120 or 122 applied respectively to the gate of FET 256 or FET 260 discharges associated data read line 250 or 252.

Consequently, when cell 104 is not masked (i.e., MB=0), the voltages on lines 250 and 252 are respectively complementary to the voltages on lines 120 and 122 and, therefore, have binary values that are respectively the same as and the complement of data bit DB. However, when MB=1, cell 104 is masked and the resulting low logic levels of EV1 and EV2, as coupled to lines 120 and 122, turn off FETs 256 and 260 to prevent discharging read lines 250 and 252. Accordingly, masking cell 104 masks both read circuits 124, 126 as well as matching circuits 128, 130.

Hence, for a first combination of binary values written into cell 104 (EV1=0, EV2=0), the resulting low voltages on data lines 120 and 122 are read on lines 250 and 252 as high voltages. For a second combination of binary values written into cell 104 (EV1=1, EV2=0), the resulting high and low voltages on data lines 120 and 127 are read on lines 250 and 252 as low and high voltages, respectively. For a third combination of binary values written into cell 104 (EV1=0, EV2=1), the resulting low and high voltages on data lines 120 and 122 are read on lines 250 and 252 as high and low voltages, respectively. Inverters (not shown) can invert the voltages on lines 250 and 252 to the same values that cell 100 stored, as appropriate.

With reference to FIG. 2, dual port CAM array 102 includes an array of dual port CAM cells 100 arranged in a matrix of M rows and N columns. The cells in each row of the array are connected to respond to voltages on a respective pair of word lines, such as WL1(0) and WL2(0), or WL1(M−1) and WL2(M−1). The cells in each column are also connected to drive a respective pair of match lines, such as ML1(0) and ML2(0), or ML1(N−1) and ML2(N−1).

The cells in each column are connected to respond to voltages on respective first and second pairs of encoded lines, such as EL1(0) and EL2(0). Each pair of encoded lines carries first and second encoded values, e.g., EV1 and EV2, supplied to the pair of encoded lines by a respective encoder 140. The cells in each column are also connected to respond to voltages on respective first and second pairs of reference data lines, such as RDL1(0) and RDL2(0). Each pair of reference data lines carries reference data values, e.g., RB1 and RB2, supplied to the pair of reference data lines by a respective reference data generator 240.

Each respective encoder 140 receives a data bit and a mask bit, e.g., DB1(0) and MB1(0), on respective input lines of the encoder. Similarly, each respective reference generator receives a reference bit and clock wave, e.g., RB1(0) and CLK, on respective input lines of the encoder.

Although omitted from FIG. 2 for the sake of clarity, it is to be understood that the cells in each row of the array are also connected to respond to the voltages on a respective pair of read dump lines, while the cells of each column are connected to drive respective first and second pairs of read data lines for reading data stored by the cells.

While there has been described and illustrated one specific embodiment of the invention, it will be clear that variations in the details of the embodiment specifically illustrated and described may be made without departing from the true spirit and scope of the invention as defined in the appended claims.

I claim:

1. A semiconductor memory cell for storing more than two binary states in response to more than two combinations of binary levels from first and second binary sources, the cell comprising: first and second signal input terminals for signals to be stored in the cell, the first and second input signal terminals being arranged for connection to be responsive to the more than two combinations of binary levels of the first and second binary sources, first and second data lines, and active circuit elements having inputs connected to be responsive to voltages at the first and second input terminals for supplying voltages to the first and second data lines so that the cell stores and supplies to the first and second data lines (a) a first combination of binary voltage levels in response to the first and second binary sources writing a first combination of binary levels into the cell via the first and second signal input terminals, (b) a second combination of binary voltage levels in response to the first and second binary sources writing a second combination of binary levels into the cell via the first and second signal input terminals, and (c) a third combination of binary voltage levels in response to the first and second binary sources writing a third combination of binary levels into the cell via the first and second signal input terminals.

2. The cell of claim 1 wherein the active elements of the cell include inverters connected to each other in a regenerative feedback circuit.

3. The cell of claim 2 wherein the cell includes first, second, third and fourth inverters, each of the inverters including an input terminal and an output terminal, the input and output terminals of the first and second inverters being connected to each other to form a first regenerative feedback circuit, the input and output terminals of the third and fourth inverters being connected to each other to form a second regenerative feedback circuit, the input terminal of the first inverter being selectively coupled during a write operation to the first signal input terminal of the cell, the input terminal of the third inverter being selectively coupled during a write operation to the second signal input terminal of the cell, the output terminal of the first inverter connected to the first data line of the cell, the output terminal of the third inverter being the second data line of the cell.

4. The cell of claim 3 wherein the first regenerative feedback circuit includes a circuit element for disabling the first inverter in response to the binary levels on the first and second signal input terminals of the cell having a first combination of values so that substantially the same voltage level as at the input terminal of the first inverter is supplied to the input terminal of the second inverter in response to the binary levels at the cell input terminals having the first combination of values.

5. The cell of claim 4 wherein the second regenerative feedback circuit includes a circuit element for disabling the third inverter in response to the binary levels on the first and second input terminals of the cell having a second combination of values so that substantially the same voltage level as at the input terminal of the third inverter is supplied to the input terminal of the fourth inverter in response to the binary levels at the cell input terminals having the second combination of values.

6. A semiconductor memory cell adapted to be responsive to first and second binary sources and for storing three combinations of values of the first and second binary sources comprising first and second latches, each of the latches having first and second storage nodes, the first and second storage nodes of the first latch being respectively connected to be responsive to the first and second binary sources during a write operation of the cell, the first and second nodes of the second latch being respectively connected to be responsive to the second and first binary sources during a write operation of the cell, each of the latches including first binary sources during the write operation, each of the latches including substantially identical circuitry including (a) first and second inverters selectively connected in a regenerative back-to-back relation between the first and second nodes, and (b) a control circuit responsive to the bit at one of the nodes for controlling the connections of the inverters to each other.

7. The memory cell of claim 6, wherein the first inverter has an input connected to the first node and an output connected to the second node, the second inverter selectively being connected for supplying the first node with an inverted replica of voltage at the second node, the control circuit being connected to be responsive to the voltage at the first node for controlling activation of the second inverter.

8. The memory cell of claim 7, wherein the first and second binary sources have the same value in a first of the combinations, the control circuit and the first and second inverters being connected and arranged so that the control circuit disables the second inverter in response to the first and second binary sources having the values for the first combination to cause a first voltage associated with the value of the first binary source in the first combination to be supplied to and maintained at the first node and a voltage between the voltage levels of the bits for the first combination to be at the second node during the write operation, and to cause the first voltage to remain at the first node after the write operation for the first combination has been concluded until the next write operation for the cell occurs.

9. The cell of claim 8, wherein the control circuit and the first and second inverters are arranged so that the second node is driven to a second voltage level after the write operation for the first combination has been concluded until the next write operation for the cell occurs.

10. The cell of claim 9, wherein the first and second binary sources respectively have first and second different values in a second of the combinations, the control circuit and the first and second inverters being connected and arranged so that in response to the first and second bits having the values for the first combination the first and second inverters are enabled so the first and second different values are respectively supplied to and maintained at the first and second nodes during the write operation for the first combination and after the write operation for the first combination has been concluded until the next write operation for the cell occurs.

11. The cell of claim 10, wherein the first and second bits respectively have the second and first values in a third of the combinations, the control circuit and the first and second inverters being connected and arranged so that in response to the first and second bits having the values for the third combination the second and first different values are respectively supplied to and maintained at the first and second nodes during the write operation for the second combination and after the write operation for the second combination has been concluded until the next write operation for the cell occurs.

12. The cell of claim 8, wherein the second inverter includes an element that is connected to be responsive to the voltage at the second node so that the element is switched to a low impedance state and connected to supply the second voltage to the first node in response to the first voltage being at the second node.

13. A semiconductor memory cell adapted to be responsive to first and second binary sources and for storing more than two combinations of values of the first and second binary sources comprising first and second latches, each of the latches having first and second storage nodes, the first and second nodes of the first latch being respectively connected to be responsive to the first and second binary sources during a write operation of the cell, the first and second nodes of the second latch being respectively connected to be responsive to the second and first binary sources during the write operation, each of the latches including substantially identical circuitry including first and second inverters selectively connected in a regenerative back-to-back relation between the first and second nodes, and a control circuit for enabling the inverters to store more than two combinations of the values of the bits of the binary sources.

14. The cell of claim 13, wherein the first and second bits have the same value in a first of the combinations, the first and second inverters being connected and arranged so that the second inverter is disabled in response to the first and second bits having the values for the first combination to cause the first voltage associated with the value of the first bit in the first combination to be supplied to and maintained at the first node and a voltage between first and second voltage levels of the bits for the first combination at the second node during the write operation and to cause the first voltage to remain at the first node after the write operation for the first combination has been concluded until the next write operation for the cell occurs.

15. The cell of claim 14, wherein the first and second inverters are arranged so that the second node is driven to the second voltage level after the write operation for the first combination has been concluded until the next write operation for the cell occurs.

16. The cell of claim 14, wherein the first and second bits respectively have first and second different values in a second of the combinations, the first and second inverters being connected and arranged so that in response to the first and second bits having the values for the second combination the first and second inverters are enabled so the first and second different values are respectively supplied to and maintained at the first and second nodes during the write operation for the second combination and after the write operation for the first combination has been concluded until the next write operation for the cell occurs.

17. The cell of claim 16, wherein the first and second bits respectively have the second and first different values in a third of the combinations, the control circuit and the first and second inverters being connected and arranged so that in response to the first and second bits having the values for the third combination the second and first different values are respectively supplied to and maintained at the first and second nodes during the write operation for the third combination and after the write operation for the third combination has been concluded until the next write operation for the cell occurs.

18. The cell of claim 14, wherein the second inverter includes an element that is connected to be responsive to the voltage at the second node so that the element is switched to a low impedance state and connected to supply the second voltage to the first node in response to the first voltage being at the second node.

19. The cell of claim 13, wherein the latches are included in a dual port CAM cell including first and second read circuits respectively connected to first and second data lines connected to be responsive to voltages at the first and second nodes, and first and second match circuits respectively connected to first and second complementary reference lines and both connected to the first and second data lines.

20. The cell of claim 13 wherein the first and second binary sources have (a) the same bit values in a first of the combinations, (b) first and second different bit values in a second of the combinations, and (c) the second and first bit values in a third of the combinations, the second inverter including first and second complementary FETs having series connected source drain paths and gate electrodes connected to be responsive to the voltage at the second node, the control circuit including (a) a third FET having a source drain path connected in series with the source drain paths of the first and second FETS and (b) a driver having an input connected to be responsive to the voltage at the first node and an output for driving the gate electrode of the third FET, the FETs and driver being arranged so that in response to (1) the first combination the driver causes the third FET to disable the second inverter so that (a) during a write operation the first node is substantially at a first DC power supply voltage of the cell and the second node is at a voltage between the first power supply voltage and a second DC power supply voltage of the cell, and (b) subsequent to the write operation and until the next write operation the first and second nodes are respectively substantially at the first and second power supply voltages, to cause the first FET to be on and supply the first power supply voltage to the first node, (2) the second combination the driver causes the third FET to be on to enable the second inverter so that during a write operation and subsequent to the write operation and until the next write operation the voltages at the first and second nodes are respectively substantially at the second and first power supply voltages, and (3) the third combination the driver turns off the third FET to disable the second inverter and the voltage at the second node turns on the first FET to supply the first power supply voltage to the first node so that during a write operation and subsequent to the write operation and until the next write operation the voltages at the first and second nodes are respectively substantially at the first and second power supply voltages, and read circuitry connected to respond to the voltages at the first node of each latch.

* * * * *